(12) United States Patent
Okamoto et al.

(10) Patent No.: US 9,368,609 B2
(45) Date of Patent: Jun. 14, 2016

(54) SEMICONDUCTOR DEVICE INCLUDING A TRENCH WITH A CORNER HAVING PLURAL TAPERED PORTIONS

(71) Applicant: Renesas Electronics Corporation, Kawasaki-shi (JP)

(72) Inventors: Yasuhiro Okamoto, Kawasaki (JP); Tatsuo Nakayama, Kawasaki (JP); Takashi Inoue, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/332,954

(22) Filed: Jul. 16, 2014

(65) Prior Publication Data

US 2015/0048419 A1    Feb. 19, 2015

(30) Foreign Application Priority Data

Aug. 15, 2013    (JP) .................................. 2013-168869

(51) Int. Cl.
| | |
|---|---|
| *H01L 29/205* | (2006.01) |
| *H01L 29/778* | (2006.01) |
| *H01L 29/423* | (2006.01) |
| *H01L 29/66* | (2006.01) |
| *H01L 29/06* | (2006.01) |
| *H01L 29/20* | (2006.01) |

(52) U.S. Cl.
CPC ........ *H01L 29/7786* (2013.01); *H01L 29/0692* (2013.01); *H01L 29/42364* (2013.01); *H01L 29/66462* (2013.01); *H01L 29/7789* (2013.01); *H01L 29/2003* (2013.01)

(58) Field of Classification Search
CPC ............................. H01L 29/205; H01L 29/78
See application file for complete search history.

(56) References Cited

U.S. PATENT DOCUMENTS

| | | | |
|---|---|---|---|
| 6,251,739 B1 * | 6/2001 | Norstrom et al. | ............. 438/369 |
| 2013/0292700 A1 * | 11/2013 | Teramoto et al. | ................ 257/76 |

FOREIGN PATENT DOCUMENTS

| | | |
|---|---|---|
| JP | 2008-306083 A | 12/2008 |
| JP | 2012-248636 A | 12/2012 |

* cited by examiner

*Primary Examiner* — Peter Bradford
(74) *Attorney, Agent, or Firm* — McGinn IP Law Group, PLLC (57) ABSTRACT

A semiconductor device has a channel layer formed above a substrate, a barrier layer formed over the channel layer and having a band gap larger than that of the channel layer, a trench passing through the barrier layer as far as a midway of the channel layer, and a gate electrode disposed byway of a gate insulation film in the inside of the trench. Then, the end of the bottom of the trench is in a rounded shape and the gate insulation film in contact with the end of the bottom of the trench is in a rounded shape. By providing the end of the bottom of the trench with a roundness as described above, a thickness of the gate insulation film situated between the end of the bottom of the gate electrode and the end of the bottom of the trench can be decreased. Thus, the channel is formed also at the end of the bottom of the trench to reduce the resistance of the channel.

6 Claims, 11 Drawing Sheets

SEMICONDUCTOR DEVICE INCLUDING A TRENCH WITH A CORNER HAVING PLURAL TAPERED PORTIONS

CROSS-REFERENCE TO RELATED APPLICATIONS

The disclosure of Japanese Patent Application No. 2013-168869 on Aug. 15, 2013 including the specification, drawings, and abstract is incorporated herein by reference in its entirety.

BACKGROUND

The present invention concerns a semiconductor device and a method of manufacturing the semiconductor device which can be utilized suitably to semiconductor devices, for example, using nitride semiconductors.

In recent years, semiconductor devices using group III-V compounds having a larger bang gap than Si have been noted. Among them, development has been progressed for semiconductor devices which are power MISFET (Metal Insulator Semiconductor Field Effect Transistor) using gallium nitride and which enable normally off operation in view of high voltage withstanding and high speed switching characteristics.

For example, Japanese Unexamined Patent Application Publication No. 2008-306083 discloses a group III-V nitride semiconductor field effect transistor having a gradient portion at the bottom of a gate electrode.

Further, Japanese Unexamined Patent Application Publication No. 2012-248636 discloses a field effect transistor having a channel layer and 2 DEG at a hetero-junction interface between the channel layer and an electron supply layer.

SUMMARY

The present inventors have been engaged in research and development of semiconductor devices using the nitride semiconductors as described above and have now been under earnest study for the improvement of characteristics of normally off semiconductor devices. In the course of the study, it has been found that there is a room for further improvement in the characteristics of the semiconductor devices using the nitride semiconductors.

Other subjects and novel features of the invention will become apparent by reading the description of the present specification in conjunction with appended drawings.

An outline of typical embodiments disclosed in the present application is to be described simply.

A semiconductor device shown in a preferred embodiment disclosed in the present application has a gate electrode disposed by way of a gate insulation film in a trench that extends through a second nitride semiconductor layer as far as a midway of a first nitride semiconductor layer. Then, the end of the bottom of the trench has a rounded shape or a chamfered shape.

A method of manufacturing a semiconductor device shown in one embodiment disclosed in the present application has a step of forming a trench by etching a stack of a first nitride semiconductor layer and a second nitride semiconductor layer thereover. This is a step of forming a trench that passes through the second nitride semiconductor layer as far as a midway of the first nitride semiconductor layer in which the end of the bottom has a rounded shape or a chamfered shape.

According to the semiconductor device shown in the following typical embodiments disclosed in the present invention can improve characteristics of the semiconductor device.

According to the method of manufacturing a semiconductor device shown in the following typical embodiments disclosed in the present invention, a semiconductor device of preferred characteristics can be manufactured.

DETAILED DESCRIPTION OF THE PREFERRED EMBODIMENTS

In the following embodiments, the embodiments may be described in a plurality of divided sections or embodiments if required for the sake of convenience. However, unless otherwise specified, they are not independent of each other, but are in such a relation that one is a modification example, an application example, detailed explanation, complementary explanation, or the like of a part or the entirety of the other. Further, in the following embodiments, when reference is made to the number of elements or the like (including number of piece, numerical value, quantity, range, or the like), the number of elements is not limited to the specified number, but may be greater than or less than the specified number unless otherwise specified and except the case where the number is apparently limited to the specified number in principle.

Further, in the following embodiments, the constitutional elements (including element steps or the like) are not always essential unless otherwise specified and except the case where they are apparently considered essential in principle. Similarly, in the following embodiments, when reference is made to shapes, positional relationships, or the like of the constitutional elements or the like, they include ones substantially analogous or similar to the shapes or the like unless otherwise specified and expect the case where it is considered that they are apparently not so in principle. This is also applicable to the foregoing number or the like (including number of piece, numerical value, quantity, range, or the like).

Embodiments of the present invention are to be described below in details by reference to the drawings. Throughout the drawings for describing the embodiments, members having the same function are given with same or corresponding reference signs, and duplicate description therefor is omitted. Further, where a plurality of similar members (portions) are present, individual or specified portions are sometimes shown by adding symbols to collective signs. Further, in the following embodiments, a description for same or similar portions will not be repeated in principle unless it is particularly required.

Further, in the drawings used for embodiments, hatching may sometimes be omitted even in a cross-sectional view for easy understanding of the drawings. On the other hand, hatching may be sometimes added even in a plan view for easy understanding of the drawings.

Further, in cross sectional views and plan views, the size for each of portions does not correspond to that of an actual device but a specified portion is sometimes depicted relatively larger for easy understanding of the drawings. Further also in the case where a cross sectional view and a plan view correspond to each other, a specified portion is sometimes depicted relatively larger for easy understanding of the drawing.

First Embodiment

Figure 1:
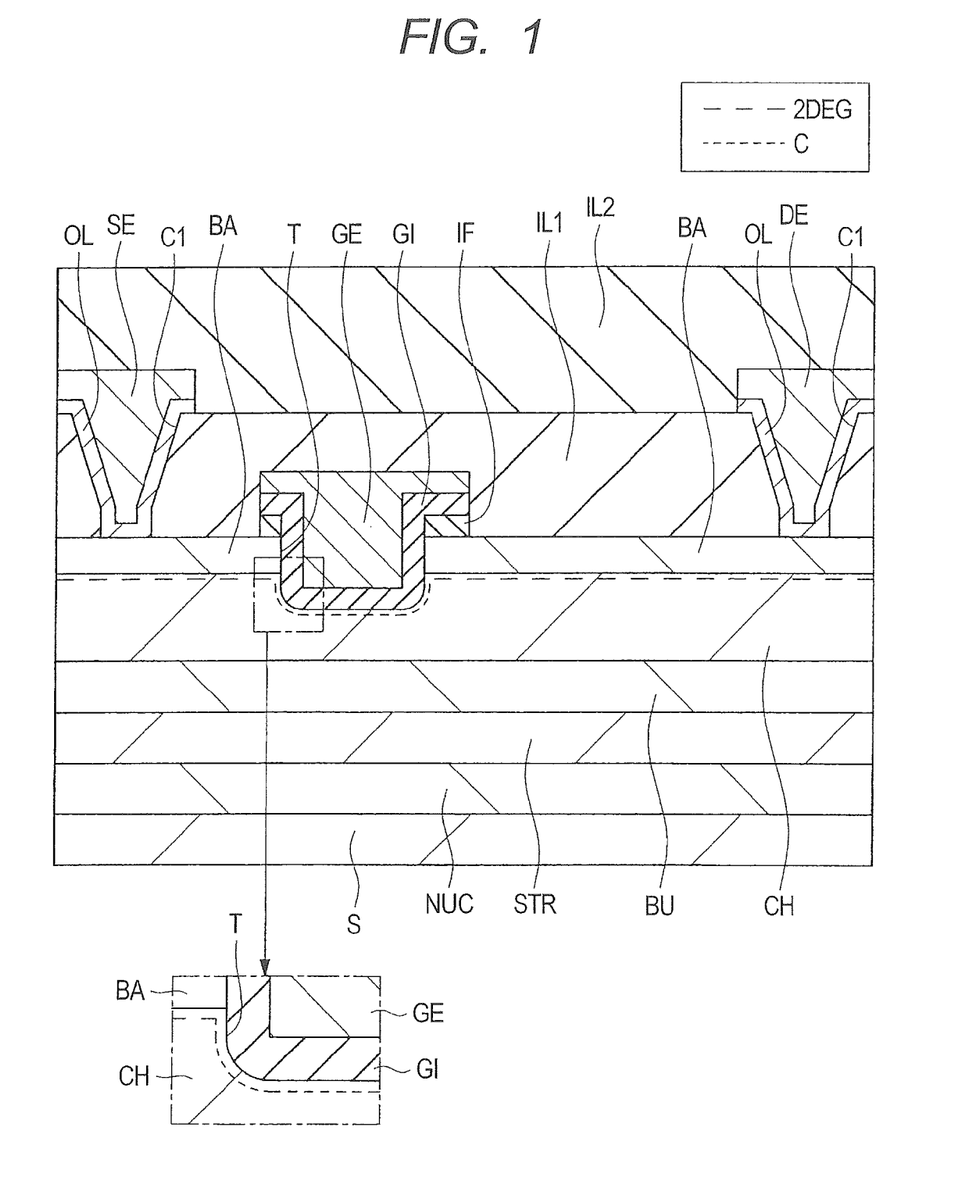
FIG. 1 is a cross sectional view illustrating a configuration of a semiconductor device of a first embodiment.

A semiconductor device of this embodiment is to be described specifically with reference to the drawings. FIG. 1 is a cross sectional view illustrating a configuration of a semiconductor device of this embodiment. FIG. 2 to FIG. 8 are cross sectional views illustrating steps of manufacturing the semiconductor device of this embodiment.

(Description of Structure)

FIG. 1 is a cross sectional view illustrating a configuration of a semiconductor device according to this embodiment. The semiconductor device illustrated in FIG. 1 is a MIS (Metal Insulator Semiconductor) field effect transistor (FET) using nitride semiconductors. The semiconductor device is also referred to as a high electron mobility transistor (HEMT) or a power transistor. The semiconductor device according to this embodiment is a so-called recessed gate type semiconductor device.

The semiconductor device of this embodiment has, a stack (nitride semiconductor region) comprising a nuclear generation layer NUC, a stress moderation layer STR, a buffer layer BU, a channel layer (also referred to as electron running layer) CH, and a barrier layer BA formed successively over a substrate S.

Further, a gate GE of the semiconductor device of this embodiment is formed by way of a gate insulation film GI inside a trench T which is engraved so as to pass through an insulation film IF and a barrier layer BA as far as a midway of the channel layer CH.

Further, a source electrode SE and a drain electrode DE of the semiconductor device of this embodiment are formed on both sides of the gate electrode GE over the barrier layer BA.

Description is to be made specifically. As illustrated in FIG. 1, in the semiconductor device of this embodiment, the nuclear generation layer NUC is formed over the substrate S, and the stress moderation layer STR is formed over the nuclear generation layer NUC. The nuclear generation layer NUC is formed in order to form crystal nuclei upon growing of layers formed above such as the stress moderation layer STR. Further, the nuclear generation layer NUC is formed in order to prevent diffusion of constituent elements in the layers formed above (for example, GA) from the layers formed above to the substrate S, thereby deteriorating the substrate S. Further, the stress moderation layer STR is formed in order to moderate stress to the substrate S thereby suppressing generation of warps or cracks in the substrate S.

A buffer layer BU is formed over the stress moderation layer STR, a channel layer comprising a nitride semiconductor (also referred to as a electron running layer) CH is formed over the buffer layer BU, and a barrier layer BA comprising a nitride semiconductor is formed over the channel layer CH. That is, the buffer layer BU, the channel layer CH, and the barrier layer BA are formed (stacked) from below successively over the main surface (upper surface) of the stress moderation layer STR. A source electrode SE and a drain electrode DE are formed respectively by way of ohmic layers OL over the barrier layer BA. The buffer layer BU is an intermediate layer situated between the channel layer CH and the stress moderation layer STR.

The gate electrode GE is formed by way of a gate insulation film GI to the inside of a trench (also referred to as trench, recess, concave portion) that is engraved through the insulation film IF and the barrier layer BA as far as a midway of the channel layer CH. The source electrode SE and the drain electrode DE are formed on both sides of the gate electrode GE over the barrier layer BA. The source electrode SE and the drain electrode DE are formed so as to be connected respectively with the barrier layer BA. Each of the electrodes is connected by way of the ohmic layer OL to provide an ohmic contact.

An insulation layer IL1 is formed over the gate electrode GE. Further, the source electrode SE and the drain electrode DE are formed in the inside and above contact holes C1 formed in the insulation layer IL1. An insulation layer IL2 is formed over the insulation layer IL1, the source electrode SE, and the drain electrode DE.

In this embodiment, a two-dimensional electron gas 2DEG is formed near the interface between the channel layer CH and the barrier layer BA on the side of the channel layer. Further, when a positive potential (threshold potential) is applied to the gate electrode GE, a channel C is formed near the interface between the gate insulation film GI and the channel layer CH.

The two-dimensional electron gas 2DEG is formed by the following mechanism. Nitride semiconductors constituting the channel layer CH and the barrier layer BA (gallium nitride type semiconductor in this embodiment) are different in view of band gap and electron affinity respectively. Therefore, a well-type potential is formed at the bonded surface of the semiconductors. When electrons are accumulated in the well-type potential, the two-dimensional electron gas 2DEG is formed near the interface between the channel layer CH and barrier layer BA.

The two-dimensional electron gas 2 DEG formed near the interface between the channel layer CH and the barrier layer BA is disconnected by the trench T in which the gate electrode GE is formed. Accordingly, the semiconductor device of this embodiment can maintain the off state when a positive potential (threshold potential) is not applied to the gate electrode GE and can maintain the on state when the positive potential (threshold potential) to the gate electrode GE. As described above, the semiconductor device can perform normally off operation.

In this embodiment, the end of the bottom of the trench T is rounded. In other words, the end of the bottom of the trench T has a rounded shape. Thus, when the end of the bottom of the trench T is rounded, the thickness of the gate insulation film GI situated between the end of the bottom of the gate electrode GE and the end of the bottom of the trench T can be decreased. In other words, the thickness of the gate insulation film GI in contact with the end of the bottom of the trench T can be decreased. This can form a channel C also at the end of the bottom of the trench T to reduce the resistance of the channel C. Further, since the channel C is formed also at the end of the bottom of the trench T and, accordingly, the distance between the channel C and the two-dimensional electron gas 2DEG can be decreased, parasitic resistance between them can be reduced.

(Description of Manufacturing Method)

Then, with reference to FIG. 2 to FIG. 8, a method of manufacturing the semiconductor device of this embodiment is to be described and the configuration of the semiconductor device is made clearer. FIG. 2 to FIG. 8 are cross sectional views illustrating the manufacturing steps of the semiconductor device of this embodiment.

Figure 2:
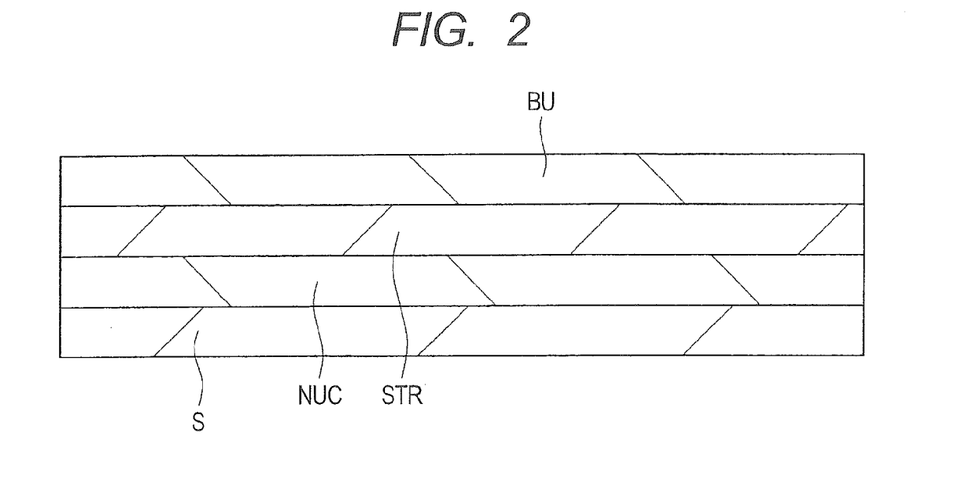
FIG. 2 is a cross sectional view illustrating a step of manufacturing the semiconductor device of the first embodiment.

As illustrated in FIG. 2, a nuclear generation layer NUC, stress moderation layer STR, and a buffer layer BU are formed successively over a substrate S. A semiconductor substrate, for example, comprising silicon Si and exposed at a (111) face is used as the substrate S and, for example, an aluminum nitride (AlN) layer is heteroepitaxially grown as a nuclear generation layer NUC by using an MOCVD (metal organic chemical vapor deposition) method thereover. Then, a super lattice structure formed by repeatedly stacking stacked films each comprising a gallium nitride (GaN) layer and an aluminum nitride (AlN) layer (AlN/GaN film) is formed as a stress moderation layer STR. For example, the gallium nitride (GaN) layer and the aluminum nitride (AlN) layer are heteroepitaxially grown each at a film thickness of about 2 to 3 nm and each by 100 layers (200 layers in total) repeatedly by using, for example, a metal organic chemical vapor deposition method. As the substrate S, a substrate comprising SiC, sapphire, or the like may also be used in addition to silicon.

Then, a buffer layer BU is formed over the stress moderation layer STR. For example, an AlGaN layer is heteroepitaxially grown as the buffer layer BU over the stress removing layer STR by using, for example, a metal organic chemical vapor deposition method.

Figure 3:
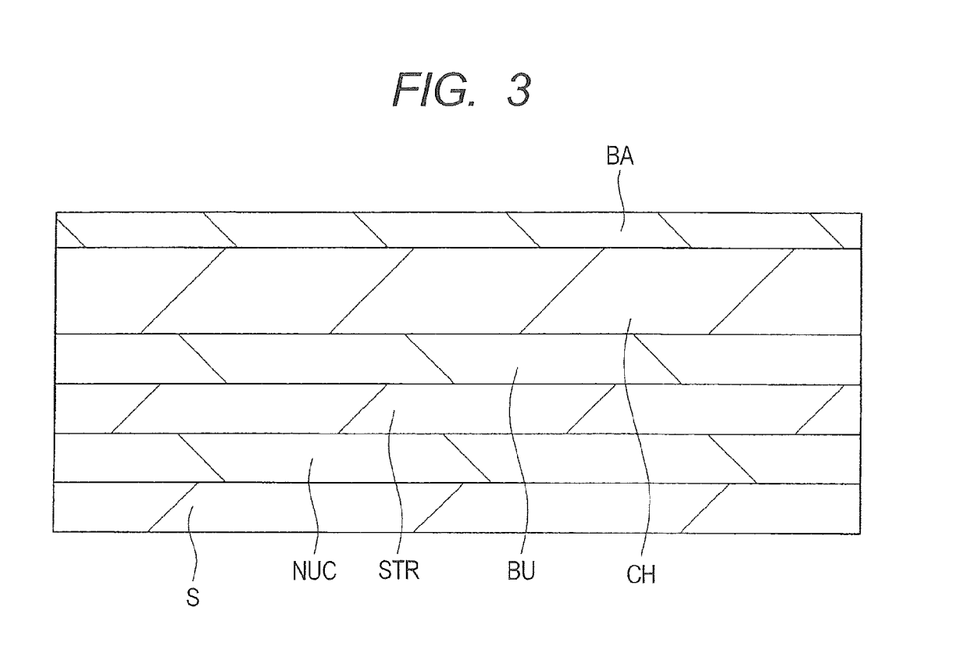
FIG. 3 is a cross sectional view illustrating a step of manufacturing the semiconductor device of the first embodiment, which is a cross sectional view illustrating a manufacturing step succeeding to FIG. 2.

Then, as illustrated in FIG. 3, a channel layer CH is formed over the buffer layer BU. For example, a gallium nitride (GaN) layer is heteroepitaxially grown over the buffer layer BU by using, for example, a metal organic chemical vapor deposition method.

Then, for example, an AlGaN layer is heteroepitaxially grown as a barrier layer BA over the channel layer CH by using, for example, a metal organic chemical vapor deposition method. The barrier layer BA comprises a nitride semiconductor having a band gap larger than the channel layer CH.

As described above, a stack of the buffer layer BU, the channel layer CH, and the barrier layer BA is formed. The stack is formed by the heteroepitaxial growing, that is, by group III growing face stacking in [0001] crystal orientation (C axis). In other words, the stack is formed by the (0001) Ga plane growing. A two-dimensional electron gas (2DEG) is formed in the stack near the interface between the channel layer CH and the barrier layer BA.

Figure 4:
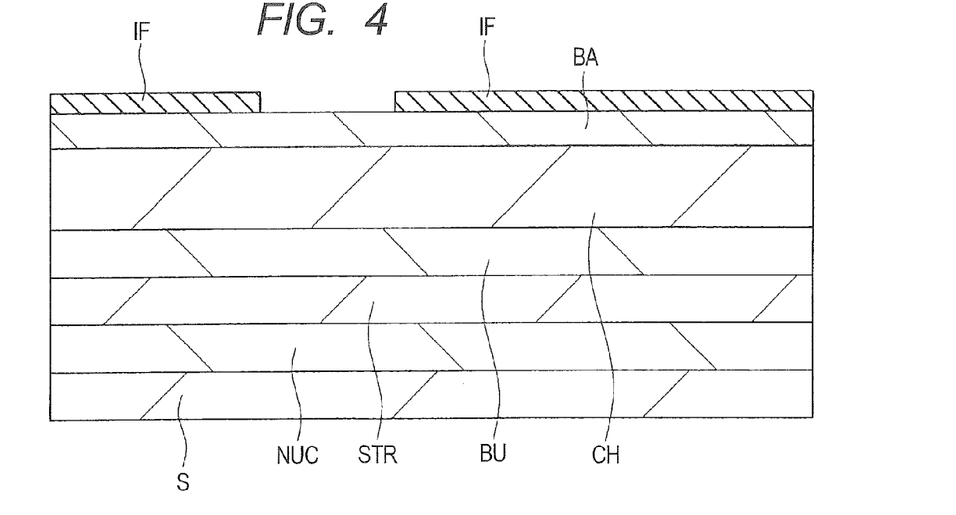
FIG. 4 is a cross sectional view illustrating a step of manufacturing the semiconductor device of the first embodiment, which is a cross sectional view illustrating a manufacturing step succeeding to FIG. 3.

Then, as illustrated in FIG. 4, an insulation film IF having an opening is formed over the barrier layer BA. For example, a silicon nitride film is deposited as the insulation film IF over the barrier layer BA using thermal CVD (Chemical Vapor Deposition) or the like. Then, an opening is formed in the insulation film IF by using a photolithographic technique and an etching technique.

Figure 5:
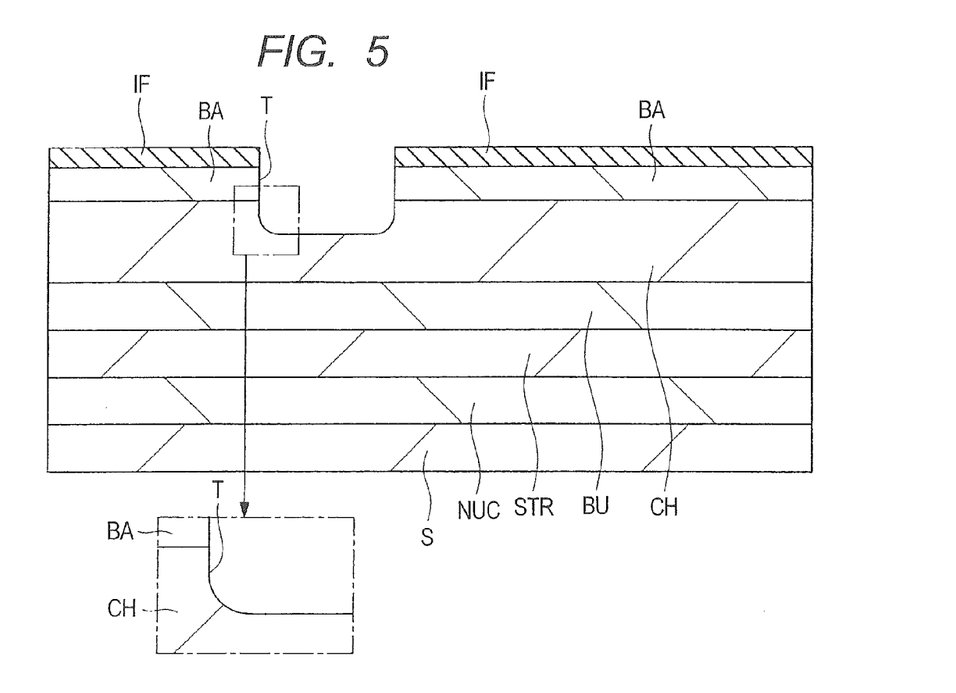
FIG. 5 is a cross sectional view illustrating a step of manufacturing the semiconductor device of the first embodiment, which is a cross sectional view illustrating a manufacturing step succeeding to FIG. 4.

Then, as illustrated in FIG. 5, the barrier layer BA and the channel layer CH are etched by using the insulation film IF as a mask, thereby forming a trench T that passes through the insulation film IF and the barrier film BA as far as a midway of the channel layer CH.

In this step, the end of the bottom of the trench T is rounded by controlling the etching condition. In other words, the end of the bottom of the trench T has a roundness. As an etching gas, for example, a chlorine type gas (for example, $BCl_3$) is used.

For example, after etching the barrier layer BA and the channel layer CH in a state where the content of an anisotropic etching ingredient is larger and then etching is applied while changing to a state where the content of an isotropic etching ingredient is larger than the anisotropic etching ingredient using the insulation film IF as a mask. Thus, the end of the bottom of the trench T can be rounded. For increasing the isotropic etching ingredient, etching is applied, for example, by lowering a bias potential to the substrate S. The end of the bottom of the trench T can be rounded by controlling various etching conditions, for example, by changing etching gas species, as well as increasing a plasma density, increasing a gas pressure, and increasing a flow rate of the process gas.

According to the study of the present inventors, a groove T in which the end of the bottom is rounded at a desired trench depth could be formed by applying etching using $BCl_3$ while controlling the etching condition.

After the etching, a heat treatment (annealing) may also be applied for the recovery of etching damages.

Figure 6:
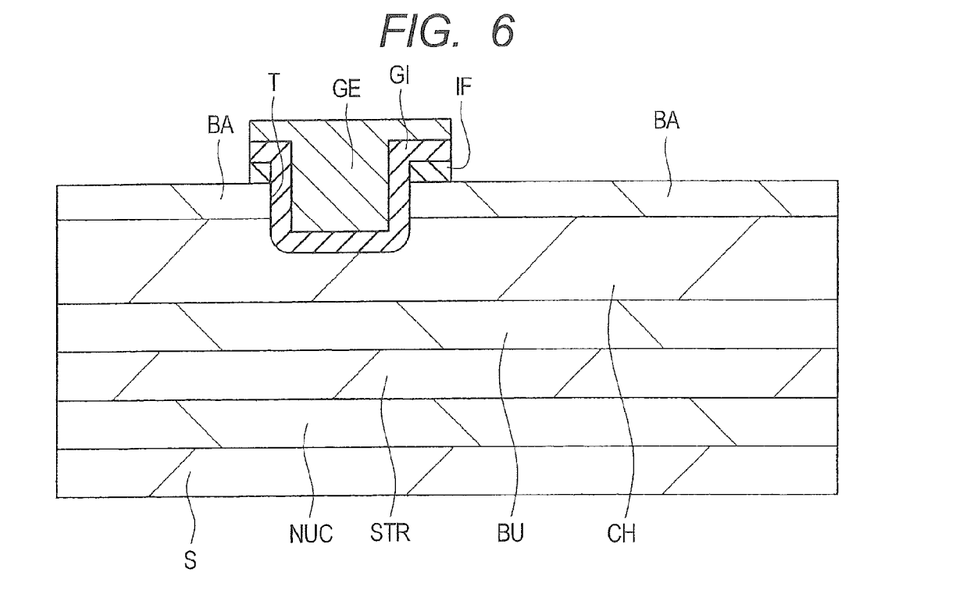
FIG. 6 is a cross sectional view illustrating a step of manufacturing the semiconductor device of the first embodiment, which is a cross sectional view illustrating a manufacturing step succeeding to FIG. 5.

Then, as illustrated in FIG. 6, a gate insulation film GI is formed over the insulation film IF including the inside of the trench T. For example, aluimina (aluminum oxide film: $Al_2O_3$) is deposited as a gate insulation film GI over the insulation film IF including the inside of the trench T by CVD or the like. When the deposition method such as CVD is used, the film material is deposited isotropically. As the gate insulation film GI, a silicon oxide film or a high dielectric film having a dielectric constant higher than that of the silicon oxide film may also be used in addition to alumina. As the high dielectric film, a hafnium oxide film ($HfO_2$ film) may also be used. As the high dielectric film, other hafnium type insulation films such as hafnium aluminate film, a HfON film (hafnium oxynitride film), a HfSiO film (hafnium silicate film), a HfSiON film (hafnium silicon oxynitride film), and HfAlO film may also be used.

Then, a gate electrode GE is formed over the gate insulation film GI in the inside of the trench T. For example, a stack film comprising, for example, a nickel (Ni) film and a gold (Au) thereon film (also referred to as Au/Ni film) is deposited as a conductive film over the gate insulation film GI about at a thickness to filling the inside of the trench T by using sputtering or the like. Then, the Au/Ni film is patterned by using a photolithographic technique and an etching technique to form a gate electrode GE. Upon etching the Au/Ni film, the gate insulation film GI and the insulation film IF in the lower layer may be etched. Further, as the material for forming the gate electrode GE, other metal film than the Au/Ni film may also be used and, further, an impurity-containing recrystal silicon film or the like may also be used.

Figure 7:
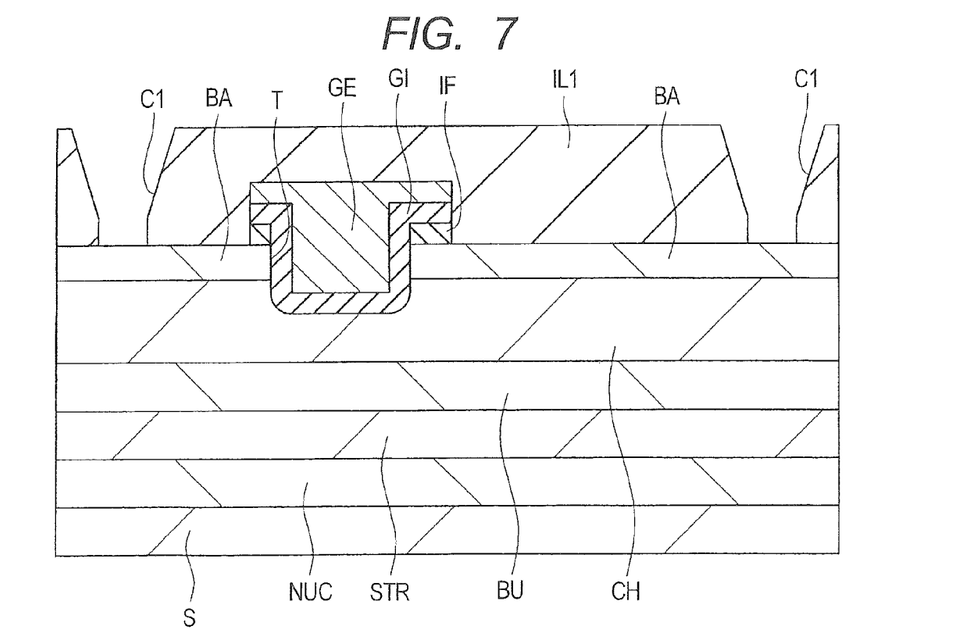
FIG. 7 is a cross sectional view illustrating a step of manufacturing the semiconductor device of the first embodiment, which is a cross sectional view illustrating a manufacturing step succeeding to FIG. 6.

Then, as illustrated in FIG. 7, an insulation layer IL1 is formed over the gate electrode GE. As the insulation layer IL1, for example, a silicon oxide film is formed over the gate electrode GE and the barrier layer BA by CVD or the like. Subsequently, contact holes C1 are formed in the insulation layer IL1 by a photolithographic technique and an etching technique. The contact holes C1 are disposed on both sides of the gate electrode GE over the barrier layer BA.

Figure 8:
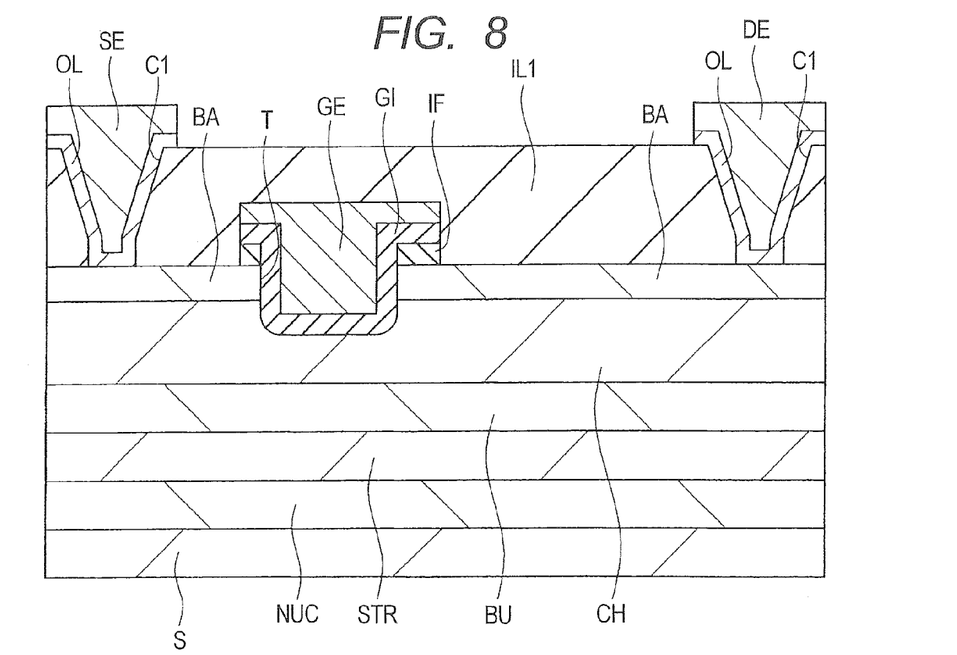
FIG. 8 is a cross sectional view illustrating a step of manufacturing the semiconductor device of the first embodiment, which is a cross sectional view illustrating a manufacturing step succeeding to FIG. 7.

Then, as illustrated in FIG. 8, an ohmic layer OL is formed over the insulation film IL1 including the inside of the contact hole C1. For example, a stack film comprising, for example, a titanium (Ti) film and an aluminum (Al) film thereon (also referred to as Al/Ti film) is deposited over the insulation layer IL1 including the inside of the contact hole C1 by vapor deposition or the like. Further, a stack film comprising, for example, a titanium (Ti) film and a titanium nitride (TiN) film present thereon (also referred to as TiN/Ti film) is deposited over the Al/Ti film by sputtering or the like. Thus, a stack film of the titanium (Ti) film, the aluminum (Al) film, the titanium (Ti) film, and the titanium nitride (TiN) film (also referred to as TiN/Ti/Al/Ti film) is formed and a heat treatment at 550° C. for about 30 minutes is applied. By the heat treatment, ohmic contact is formed at the interface between the TiN/Ti/Al/Ti film and the GaN type semiconductor. Then, an aluminum alloy film is deposited over the TiN/Ti/Al/Ti film (ohmic layer OL) by sputtering or the like. As the aluminum alloy, an alloy of Al and Si (Al—Si), an alloy of Al—Cu (copper), an alloy of Al, SiN, and Cu (Al—Si—Cu), etc. can be used. Then, the TiN/Ti/Al/Ti film and the aluminum alloy film are patterned by using a photolithographic technique and an etching technique to form a source electrode SE and a drain electrode DE by way of the ohmic layer OL in the contact holes C1.

Then, an insulation layer (also referred to as a cover film or a surface protection film) IL2 is formed over the insulation layer IL1 including the source electrode SE and the drain electrode DE. For example, a silicon oxynitride (SiON) film is deposited as the insulation layer IL2 over the insulation layer Il1 including the source electrode SE and the drain electrode DE by CVD or the like (referred to FIG. 1).

Figure 9:
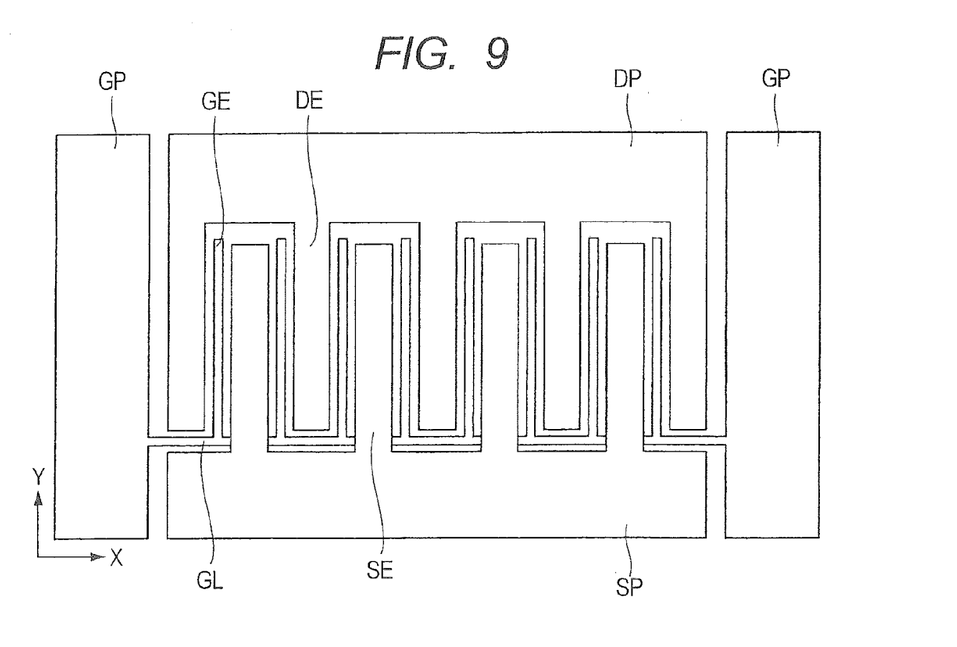
FIG. 9 is a plan view illustrating a configurational example of the semiconductor device of the first embodiment.

By the steps described above, the semiconductor device illustrated in FIG. 1 can be formed. A planar shape (layout) of the source electrode SE, the drain electrode DE, and the gate electrode GE that configure the semiconductor device is not restricted particularly and, for example, it may be a planar shape as illustrated in FIG. 9. FIG. 9 is a plan view illustrating a configurational example of the semiconductor device of this embodiment. In FIG. 9, a region between the source electrode SE and the gate electrode GE and a region between the gate electrode GE and the drain electrode DE are formed in the same manner for the sake of simplicity.

As illustrated in FIG. 9, source electrodes SE extending in a direction Y are disposed each at a predetermined pitch in a direction X. Further, drain electrodes DE extending in a direction Y are disposed each at a predetermined pitch in the direction X. Then, each of the plurality of the source electrodes SE and each of the plurality of the drain electrodes DE are disposed alternately to each other in the direction X. Further, the gate electrode GE extending in the direction Y is disposed between each of the plurality of the source electrodes SE and each of the plurality of the drain electrodes DE.

The plurality of the drain electrodes DE are connected by a drain pad DP. The drain pad DP is disposed so as to extend in the direction X on one side of the drain electrodes DE (upper side in FIG. 9). In other words, the plurality of the drain electrodes DE are disposed so as to protrude in the direction of the axis Y from the drain pad DP extending in the direction X. Such a configuration is sometimes referred to as a comb-shape.

The plurality of the source electrodes SE are connected by a source pad SP. The source pad SP is disposed so as to extend in the direction X on the other side of the source electrodes SE (lower side in FIG. 9). In other words, the plurality of the source electrodes SE are disposed so as to protrude in the direction of axis Y from the source pad SP extending in the direction X. Such a configuration is sometimes referred to as a comb-shape.

Gate pads GP are disposed on both sides (right side and left side in FIG. 9) of the source pad SP (drain pad DP). Then, the plurality of the gate electrodes GE are connected electrically with gate interconnects GL disposed so as to extend in the direction X on the side of the other end of the source electrode SE (lower side in FIG. 9). Further, the gate interconnects GL extending in the direction of the axis X are connected electrically with the gate pads GP disposed on the left end and the right end of the drawing.

Figure 10:
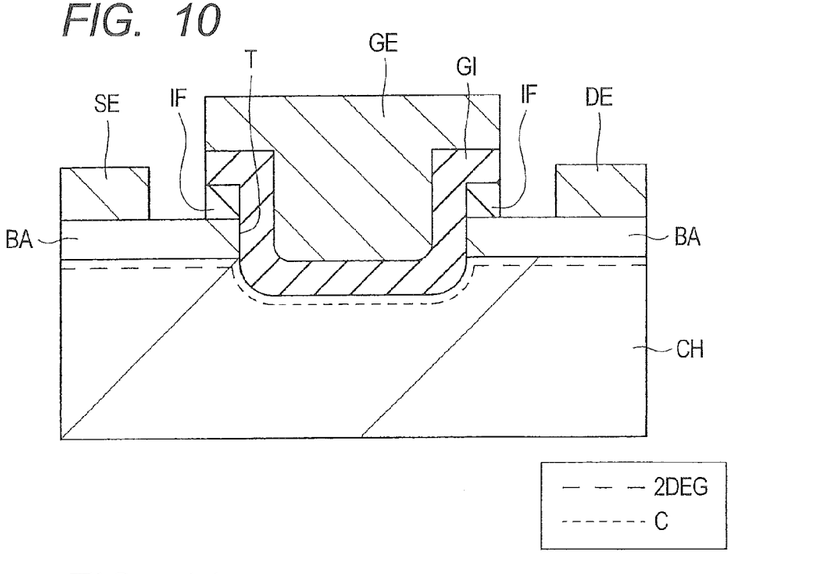
FIG. 10 is a cross sectional view illustrating a configuration near a trench of the semiconductor device of the first embodiment.
Figure 11:
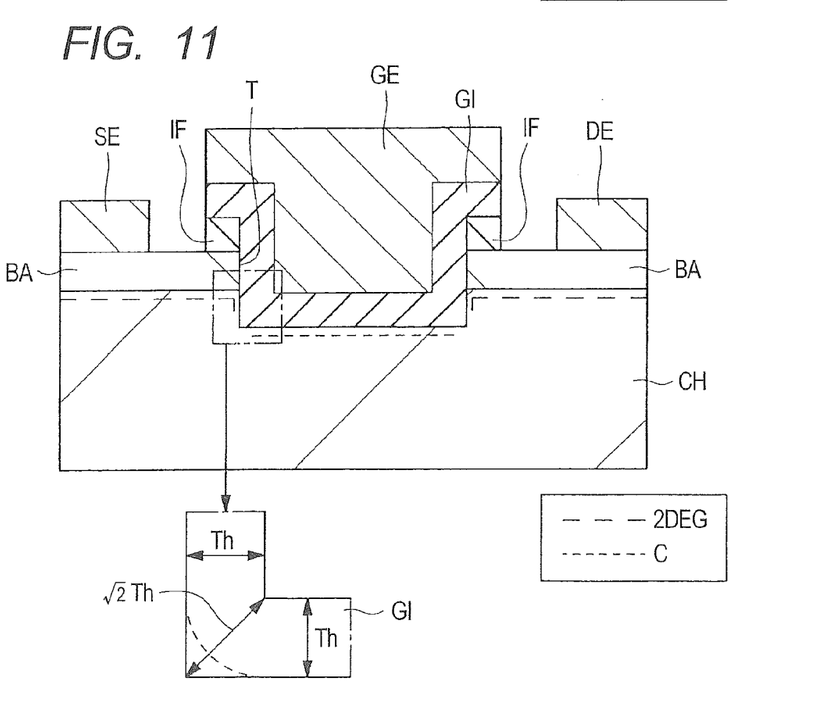
FIG. 11 is a cross sectional view illustrating a configuration near a trench of a semiconductor device of a first comparative example.
Figure 12:
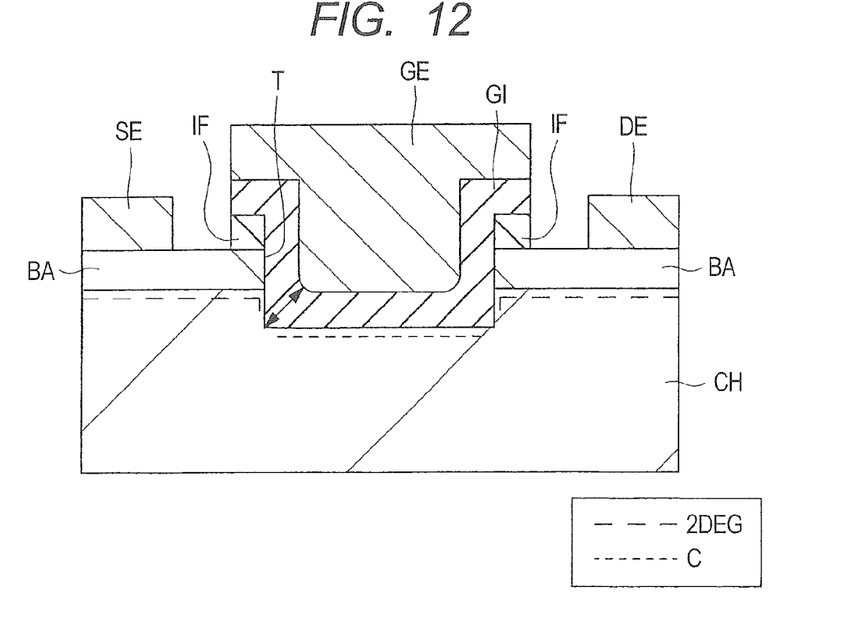
FIG. 12 is a cross sectional view illustrating a configuration near a trench of a semiconductor device of a second comparative example.
Figure 13:
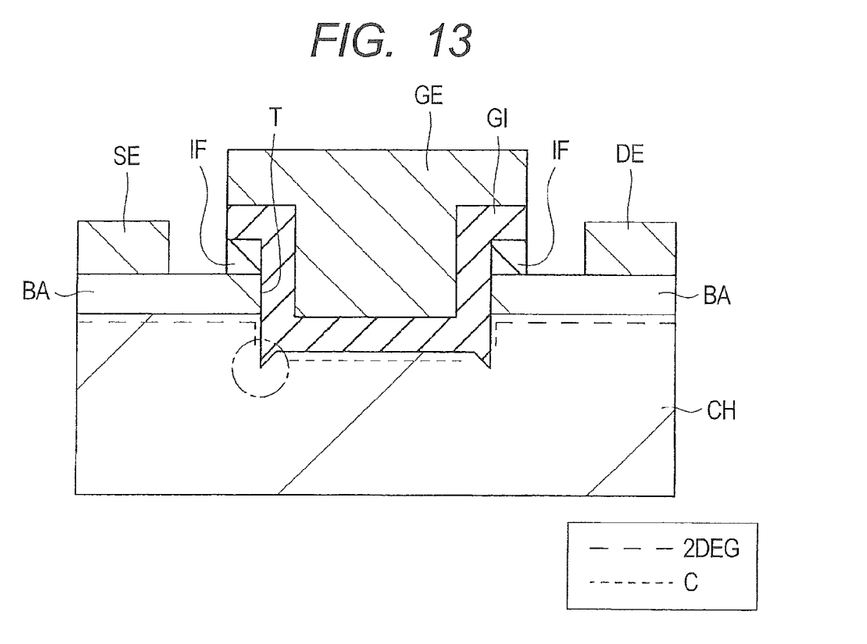
FIG. 13 is a cross sectional view illustrating a configuration near a trench of a semiconductor device of a third comparative example.

As has been described above specifically, according to this embodiment, since the end of the bottom of the trench T is rounded (refer to FIG. 1), the thickness of the gate insulation film GI situated between the end of the bottom of the gate electrode GE and the end of the bottom of the trench T can be decreased. The effect is to be described with reference to FIG. 10 to FIG. 13. FIG. 10 is a cross sectional view illustrating the configuration near the trench of the semiconductor device of this embodiment. FIG. 11 to FIG. 13 are, respectively, cross sectional views illustrating the configurations near the trench of the semiconductor devices of first to third comparative examples.

In this embodiment, since the end of the bottom of the trench T is rounded as illustrated in FIG. 10, the thickness of the gate insulation film GI situated between the end of the bottom of the gate electrode GE and the end of the bottom of the trench T can be decreased. For example, in a first comparative example illustrated in FIG. 11, the end of the bottom of the trench T has a L-shape (corner shape) in the cross sectional view. In such a case, when a gate insulation film GI having a substantially identical thickness Th is formed on the lateral wall and on the bottom of the trench T, the distance between the end of the bottom of the gate electrode GE and the end of the bottom of the trench T, that is, the thickness of the gate insulation film GI at the portion is $\sqrt{2} \times$Th ($\geq$Th). $\sqrt{2} \times$Th is a product of square root of 2 and Th. This is "$(2)^{1/2} \times$Th" in other expression.

As described above, the thickness of the gate insulation film GI increases more at the end of the bottom of the trench T than that at the central portion of the bottom of the trench T and on the side wall portion of the trench T. Accordingly, the channel C is less formed at the end of the bottom of the trench T to increase the resistance of the channel C. Further, a parasitic resistance is generated at the joined portion between the channel C and the two-dimensional electron gas 2DEG. As a result, the on resistance of the semiconductor device is increased.

On the contrary, according to this embodiment (FIG. 10), since the end of the bottom of the groove T is rounded, the thickness of the gate insulation film GI situated between the end of the bottom of the gate electrode GE and the end of the bottom of the trench T can be decreased. Thus, the channel C can be formed also at the end of the bottom of the trench T to reduce the resistance of the channel C. Further, since the channel C is formed also at the end of the bottom of the trench T and, accordingly, the distance between the channel C and the two-dimensional electron gas 2DEG can be decreased, the parasitic resistance between them can be reduced. As a result, the on resistance of the semiconductor device can be reduced.

Further, since the end of the bottom of the trench T is a portion where the material of the gate insulation film GI deposited successively to the side wall portion of the trench T and the material for the gate insulation film GI deposited successively to the bottom of the trench T are joined, the thickness of the gate insulation film GI tends to increase. Accordingly, in the L-shaped end of the bottom of the trench T as in the second comparative example illustrated in FIG. 12, a gate insulation film GI of a thickness $\sqrt{2} \times$Th or larger may possibly be formed (refer to an arrow in FIG. 12). In the second comparative example described above, the channel C is less formed and the on resistance increases further compared with the case of FIG. 11.

On the contrary, in this embodiment (FIG. 10), since the end of the bottom of the trench T is rounded, the thickness of the gate insulation film GI less increases in the portion and the on resistance can be reduced more than in the case of the second comparative example illustrated in FIG. 12.

Further, as in a further comparative example illustrated in FIG. 13, a sub-trench may sometimes be formed to the end of the bottom of the trench upon forming the trench T. In such a case, the thickness of the gate insulation film in the sub-trench is also added and the channel C is less formed at the portion (portion surrounded by a dotted circle in FIG. 13) more and more. Such sub-trench tends to be formed upon etching of the trench T. On the contrary, in this embodiment (FIG. 10), since the etching condition is controlled such that the end of the bottom of the trench T can be rounded, the sub-trench described above is less formed and the on resistance can be reduced further than in the case of the third comparative example illustrated in FIG. 13.

As have been described above specifically according to the semiconductor device of this embodiment, the on resistance of the semiconductor device can be reduced effectively.

The manufacturing steps described above are only an example and the semiconductor device of this embodiment may also be manufactured by other steps than those described above.

Modification

Figure 14A:
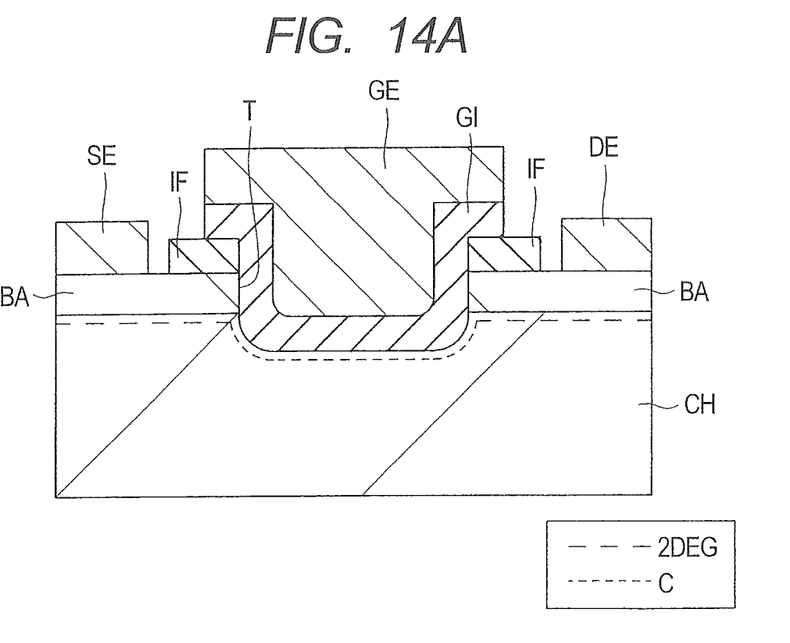
FIG. 14A is a cross sectional view schematically illustrating a configuration of a first modification of the semiconductor device of the first embodiment.
Figure 14B:
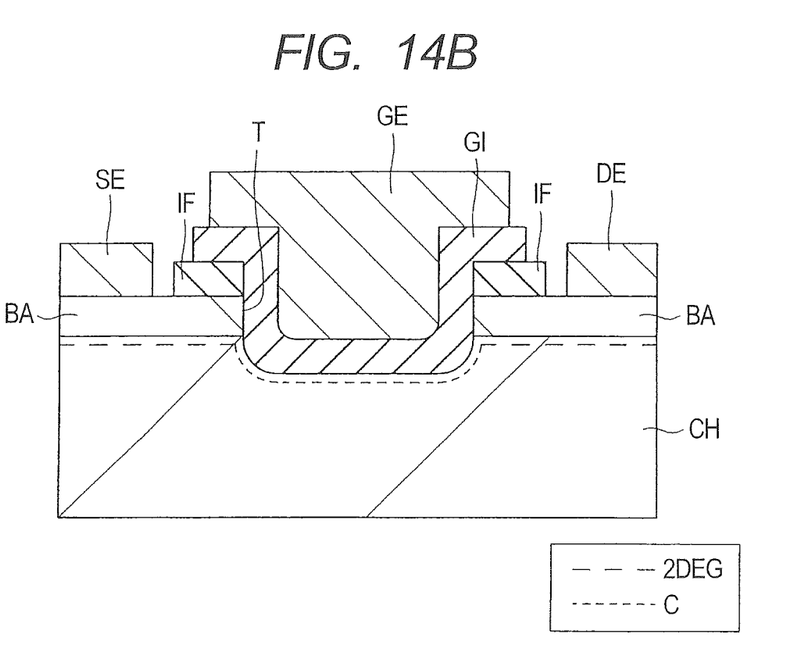
FIG. 14B is a cross sectional view schematically illustrating a configuration of a second modification of the semiconductor device of the first embodiment.

Modifications of this embodiment are to be described. In the embodiment described above, the insulation film IF, the gate insulation film GI, and the gate electrode GE over the barrier layer BA including the inside of the trench T were etched simultaneously. That is, they were patterned each in an identical planar shape by using an identical resist mask but they may be formed also to different planar shapes. FIGS. 14A and 14B are cross sectional views schematically illustrating the configuration of modifications of the semiconductor device of this embodiment. FIG. 14A is a cross sectional view of a first modification of a semiconductor device and FIG. 14B is a cross sectional view of a second modification of the semiconductor device. In the modifications, since other configurations than those for the insulation film IF, the gate insulation film GI, and the gate electrode GE, and manufacturing steps are identical with those of the embodiment described above, description therefor is to be omitted.

For example, as illustrated in FIG. 14A, after etching a gate insulation film GI and a gate electrode GE among an insulation film IF, the gate insulation film GI, and a gate electrode GE over a barrier layer BA including the inside of the trench T, the insulation film IF over the barrier layer BA may be etched in other step. Etching is applied to the insulation film IF, for example, before the step of forming a source electrode SE and a drain electrode DE. Further, the insulation film IF may be etched upon forming contact holes C1 after forming an insulation layer IL1 over the insulation film IF (refer to FIG. 7).

In this case, as illustrated in FIG. 14A, the gate electrode GE is formed by way of a gate insulation film GI in the inside of a trench T which is engraved passing through an insulation film IF and a barrier layer BA as far as a midway of a channel layer CH. A source electrode SE and a drain electrode DE are formed on both sides of the gate electrode GE over the barrier layer BA. Then, the insulation film IF below the gate insulation film GI is disposed so as to extend from the end of the gate insulation film GI and the gate electrode GE to the source electrode SE. Further, the insulation film IF below the gate insulation film GI is disposed so as to extend from the end of the gate insulation film GI and the gate electrode GE to the drain electrode DE.

Further, as illustrated in FIG. 14B, each of an insulation film IF, a gate insulation film GI, and a gate electrode GE over a barrier layer BA including the inside of the trench T may be formed to different planar shapes. In this case, among the insulation film IF, the gate insulation film GI, and the gate electrode GE over the barrier layer BA including the inside of the trench T, the gate insulation film GI is etched after etching the gate electrode GE. In this case, the gate insulation film GI below the gate electrode GE is disposed so as to extend from the end of the gate electrode GE to the source electrode SE or to the drain electrode DE. Then, after etching the gate insulation film GI, the insulation film IF over the barrier layer BA is etched. The insulation film IF is etched, for example, before the step of forming the source electrode SE and the drain electrode DE. Further, the insulation film IF may be etched also after forming an insulation layer IL1 over the insulation film IF and forming the contact holes CI (refer to FIG. 7).

Also in this case, as illustrated in FIG. 14B, the gate electrode GE is formed by way of the gate insulation film GI in the inside of the trench T which is engraved passing through the insulation film IF and the barrier layer BA as far as a midway of the channel layer CH. The source electrode SE and the drain electrode DE are formed on both sides of the gate electrode GE over the barrier layer BA. The gate insulation film GI below the gate electrode GE is disposed so as to extend from the end of the gate electrode GE to the source electrode SE. Further, the gate insulation film GI below the gate electrode GE is disposed so as to extend from the end of the gate electrode GE to the drain electrode DE. Further, the insulation film IF below the gate insulation film GI is disposed so as to extend from the end of the gate insulation film GI and the gate electrode GE to the source electrode SE. Further, the insulation film IF below the gate insulation film GI is disposed so as to extend from the end of the gate insulation film GI and the gate electrode GE to the drain electrode DE.

Second Embodiment

Figure 15:
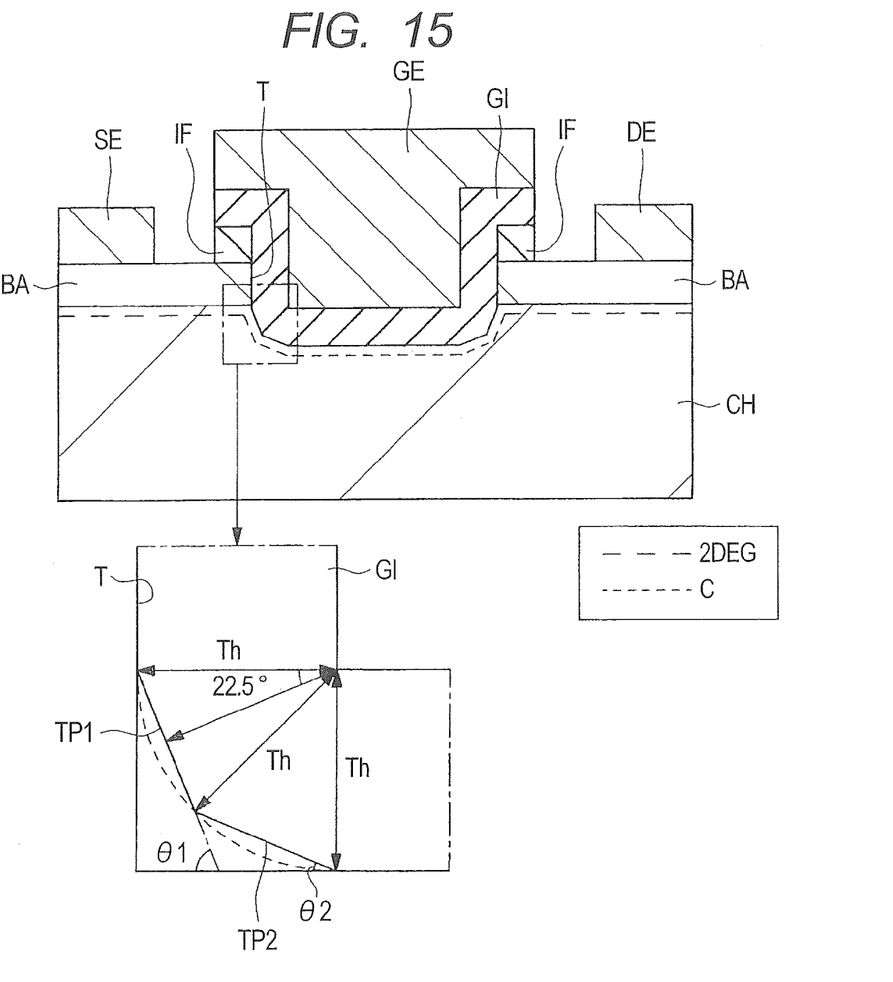
FIG. 15 is a cross sectional view schematically illustrating a configuration of a semiconductor device of a second embodiment.

In the first embodiment, the end of the bottom of the trench T was rounded, that is, the end of the bottom of the trench T had a roundness. However, it is not always necessary that the shape for the end of the bottom of the trench T is a curved shape but it may also be a shape in which a L-shaped end of the bottom of the trench T is chamfered. FIG. 15 is a cross sectional view schematically illustrating a configuration of a semiconductor device of this embodiment. In this embodiment, since other configurations than those of the trench T and the manufacturing steps are identical with those of the first embodiment, description therefor is to be omitted.

As illustrated in FIG. 15, in the semiconductor device of this embodiment, the end of the bottom of the trench T has two-step tapers (tapered portion) TP1 and TP2.

The end of the bottom of the trench T has two-step tapers TP1 and TP2 comprising the TP1 having a normal vector at an angle of 22.5° relative to the surface of the channel layer CH or the barrier layer BA or relative to the (0001) Ga plane as the surface of the central portion of the bottom of the trench T, and the taper TP2 having a normal vector at an angle of 67.5° to the surface described above. The tapers TP1 and TP2 are formed continuously. Further, the taper TP1 is disposed continuously from the side wall of the trench T. The TP2 is disposed below the taper TP1 and disposed continuously from the bottom of the trench T. Further, an angle $\theta 2$ formed between the taper TP2 and the bottom of the trench T is smaller than the angle $\theta 1$ formed between the taper TP1 and the bottom of the trench T ($\theta 1 > \theta 2$).

By providing the two-step taper structure (TP1, TP2) to the end of the bottom of the trench T, the distance between the end of the bottom of the gate electrode GE and the end of the bottom of the trench T, that is, the thickness of the gate insulation film GI at the portion can be equal to or smaller than Th. Therefore, according to the configuration of this embodiment (FIG. 15), the thickness of the gate insulation film GI situated between the end of the bottom of the gate electrode GE and the end of the bottom of the trench T (average thickness) can be decreased to less than the case of the first embodiment (refer to FIG. 10, etc.). "Thickness (average film thickness)" referred to herein is defined, for example, as a thickness of the gate insulation film GI (average film thickness) in a region which is the end of the bottom of the trench T and determined by an extension line along the surface of the gate insulation film GI on the lateral side of the trench T and an extension line along the surface of the gate insulation film GI at the bottom of the trench T (refer to a fragmentary enlarged view in FIG. 15).

By decreasing the thickness of the gate insulation film GI (average film thickness), a channel C can be formed also at the end of the bottom of the trench T to reduce the resistance of the channel C. Further, since the channel C is formed also at the end of the bottom of the trench T and, accordingly, the distance between the channel C and the two-dimensional electron gas 2DEG can be decreased, a parasitic resistance between them can be reduced. As a result, the on resistance of the semiconductor device can be reduced.

In FIG. 15, the two-step tapers TP1 and TP2 are formed at the end of the bottom of the trench T, but tapers of three or more steps may also be provided. Also in this case, an angle formed by a taper situated in lower layer decreases successively. For example, an angle $\theta n$ formed by a nth taper TPn and an angle $\theta n+1$ formed by a n+1th taper TPn+1 situated therebelow are in a relation of: $\theta n > \theta n+1$.

Figure 16:
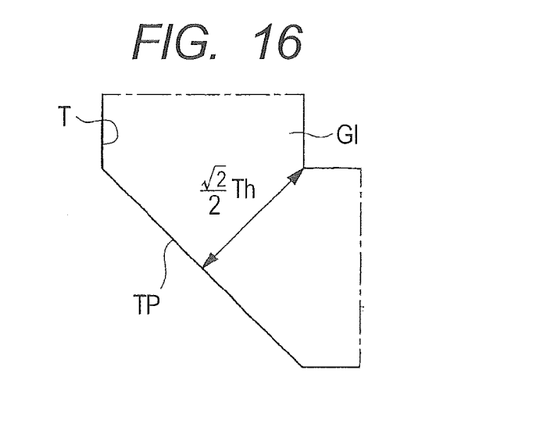
FIG. 16 is a cross sectional view illustrating other configuration for the end of the bottom of a trench of the semiconductor device of the second embodiment.

Further, a single taper may be provided at the end of the bottom of the trench T. FIG. 16 is a cross sectional view illustrating other configuration for the end of the bottom of the trench of the semiconductor device in this embodiment.

In the semiconductor device illustrated in FIG. 16, the end of the bottom of the trench T has a taper TP. For example, a taper TP having a normal vector at an angle of 45° is provided relative to the surface of a channel layer CH or a barrier layer BA, or to the (0001) Ga plane which is the surface of the central portion of the bottom of the trench T at the and of the bottom of the trench T. The taper TP is disposed continuously from the lateral wall of the trench T, and the taper TP is disposed continuously from the bottom of the trench T.

In this case, the distance between the end of the bottom of the gate electrode GE and the end of the bottom of the trench T, that is, the thickness of the gate insulation film GI at the portion can be $\sqrt{2} \times Th/2$. $\sqrt{2} \times Th/2$ is one-half of a product of square 2 and Th, that is, "$(2)^{1/2} \times Th \div 2$" in other expression. Accordingly, in the configuration illustrated in FIG. 16, the thickness of the gate insulation film GI situated between the end of the bottom of the gate electrode GE and the end of the bottom of the trench T can be decreased further. Thus, the channel C is formed also at the end of the bottom of the trench T and the resistance of the channel C can be reduced. Further, since the channel C is formed also at the end of the bottom of the trench T and, accordingly, the distance between the channel C and the two-dimensional electron gas 2DEG can be decreased, a parasitic resistance between them can be reduced. As a result, the on resistance of the semiconductor device can be reduced.

In the configuration of this embodiment, the angle and the length of the normal vector of each taper has been explained geometrically for the sake of simplicity of the explanation but the angle and the length of the normal vector of each taper are not restricted to them. That is, the thickness of the gate insulation film GI (average film thickness) at the end of the bottom of the trench T can be $\sqrt{2} \times Th/2$ or larger and smaller than $\sqrt{2} \times Th$ by forming the end of the bottom of the trench T with one taper or a plurality of continuous tapers and, ultimately, by rounding the end of the bottom as illustrated in the first embodiment. The thickness of the gate insulation film GI (average film thickness) at the end of the bottom of the trench T is more preferably within a range of Th or larger and $\sqrt{2} \times Th \times 0.8$ or smaller. By decreasing the thickness of the gate insulation film GI (average film thickness) at the end of the bottom of the trench T, the resistance of the channel C can be reduced to lower the on resistance of the semiconductor device.

The two-step tapers (TP1, TP2) or the taper TP can be formed by controlling the etching condition when the trench T is formed. The taper (TP1, TP2, TP) can be formed at the end of the bottom of the trench T, for example, by applying etching in a state where the content of anisotropic etching ingredient is large in the same manner as in the first embodiment and then controlling various etching conditions (bias condition, etching gas species, gas flow rate, gas pressure, plasma density, etc.), for example, by applying etching in a state where the content of isotropic etching ingredient is larger than the anisotropic etching ingredient.

In the first and the second embodiments described above, the cross sectional shape at the end of the bottom of the trench has been explained as a simple arcuate shape or as a tapered shape at a predetermined angle but this is merely an example and the shape is not restricted to the example. That is, so long as the thickness of the gate insulation film GI for the end at the bottom of the trench T can be deceased by forming the end at the bottom of the trench as a rounded shape, or forming the end at the bottom of the trench as a chamfered shape, R (radius of curvature) of the roundness or the tapered angle of the chamfering can take various values.

Third Embodiment
(First Example)

Figure 17:
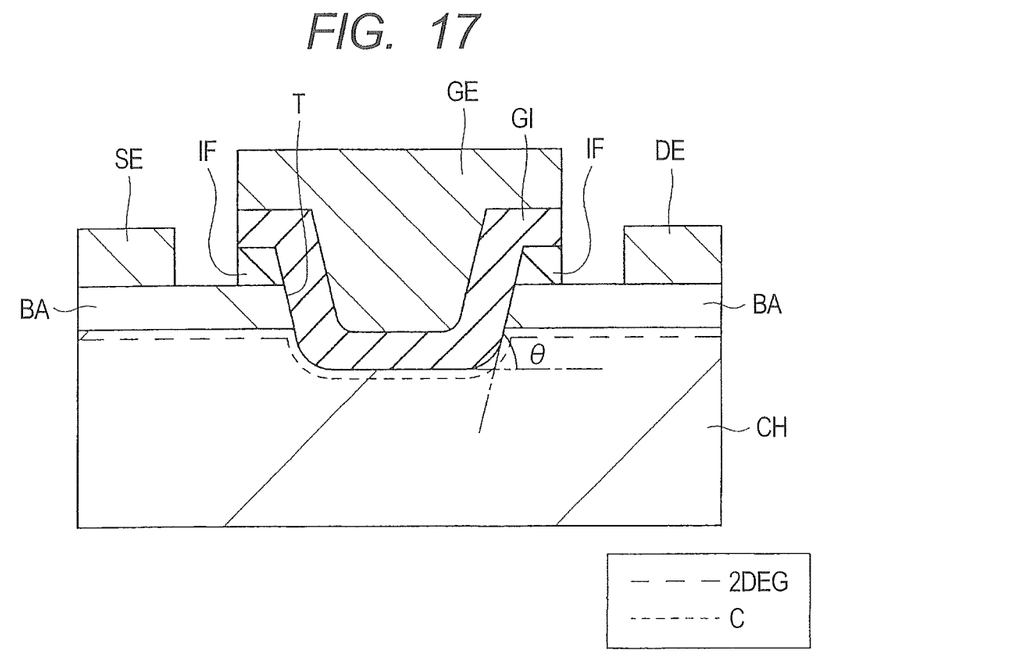
FIG. 17 is a cross sectional view schematically illustrating a configuration of a first example of a semiconductor device of a third embodiment.

In the first embodiment, the lateral side of the trench T has been explained as substantially perpendicular to the (0001) Ga plane which is the surface of the central portion of the bottom of the trench T ($\theta=90°$), but the lateral side (lateral wall) of the trench T may also be formed as a tapered shape. FIG. 17 is a cross sectional view schematically illustrating the configuration of a first example of a semiconductor device in this third embodiment. In this embodiment, since other configurations than those for the trench T and the manufacturing steps are identical with those of the first embodiment, description therefor is to be omitted.

As illustrated in FIG. 17, an angle (tapered angle $\theta$) formed between the lateral wall of the trench T and the surface of the barrier layer BA or the channel layer CH or the bottom of the trench T, that is, the (0001) Ga plane is smaller than 90° ($\theta<90°$).

For example, the tapered angle $\theta$ can be controlled to about 60 to 80° by usual dry etching using $BCl_3$.

As described above, by forming the lateral side of the trench T as a tapered shape, joining of the material for the gate insulation film GI deposited successively on the lateral wall of the trench T and the material for the gate insulation film GI deposited successively over the bottom of the trench T can be moderated to suppress increase of the thickness of the gate insulation film GI.

Further, when the lateral side of the trench T is formed as the tapered shape, as well as the end of the bottom of the trench T is formed as a rounded or chamfered shape, the thickness of the gate insulation film GI situated between the end of the bottom of the gate electrode GE and the end of the bottom of the trench T can be decreased to reduce the on resistance of the semiconductor device as has been described in the details for the first and second embodiments.

(Second Example)

Figure 18:
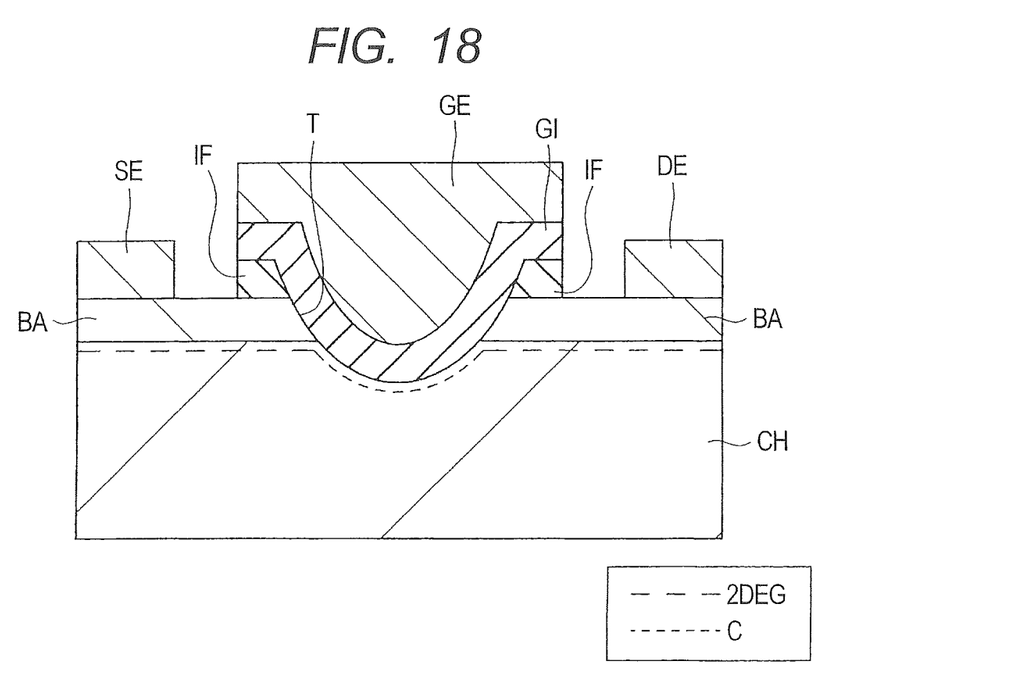
FIG. 18 is a cross sectional view schematically illustrating a configuration of a second example of the semiconductor device of the third embodiment.

In the first example, the tapered lateral side is formed to the trench T but the lateral side and the bottom of the trench T may be rounded integrally. FIG. 18 is a cross sectional view schematically illustrating the configuration of a second example of the semiconductor device of a second embodiment. In this embodiment, since other configurations than those of the trench T and the manufacturing steps are identical with those of the first embodiment, description therefor is to be omitted.

As illustrated in FIG. 18, in the second example, the lateral wall and the bottom of the trench T are rounded integrally. In other words, the lateral wall and the bottom of the trench T are integrally rounded.

That is, a trench (concave portion) T having an arcuate cross sectional shape is formed by etching a barrier layer BA and a channel layer CH using an insulation film IF having an opening as a mask over the barrier layer BA. Such a trench (concave portion) T can be formed by controlling the etching condition (for example, applying mainly anisotropic etching).

As described above, by integrally rounding the lateral surface and the bottom of the trench T, the thickness of the gate insulation film GI deposited in the inside of the trench can be formed uniformly and increase of the film thickness can be suppressed.

Further, by integrally rounding the lateral side and the bottom of the trench T, the on resistance of the semiconductor device can be reduced as has been described for the first and the second embodiments.

Fourth Embodiment
(First Example)

Figure 19:
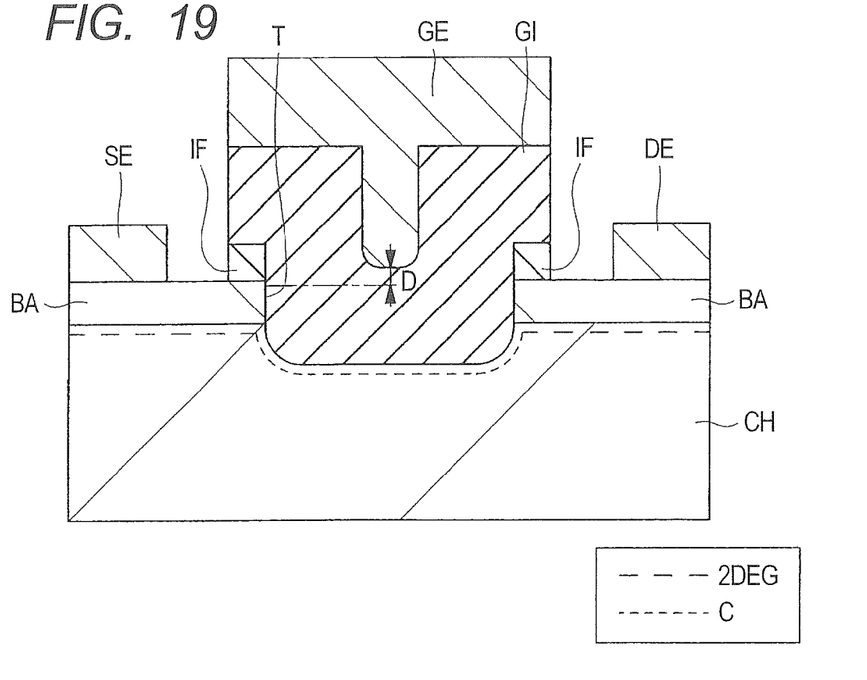
FIG. 19 is a cross sectional view schematically illustrating a configuration of a first example of a semiconductor device of a fourth embodiment.

In the first embodiment (FIG. 10), the bottom of the gate electrode GE is shown at a position lower than the position for the surface of the barrier layer BA, but the bottom of the gate electrode GE may be situated also at a position higher than the position for the surface of the barrier layer BA. FIG. 19 is a cross sectional view schematically illustrating the configuration of a first example of the semiconductor device of a fourth embodiment. In this embodiment, since other configurations than those of a trench T, a gate insulation film GI, and a gate electrode GE, and manufacturing steps are identical with those of the embodiment described above, description therefor is to be omitted.

In the first example, as illustrated in FIG. 19, the bottom of the gate electrode GE above the trench T is situated at a position higher by a distance D than the position for the surface of the barrier layer BA.

For example, assuming the depth of the trench T, that is, the distance from the surface of the barrier layer BA to the bottom of the trench T as about 40 nm, and the thickness of the gate insulation film GI as about 100 nm, the inside of the trench T is filled with the gate insulation film GI and the distance D between the surface of the gate insulation film GI (bottom of the gate electrode GE) and the surface of the barrier layer BA is about 60 nm.

As described above, when the bottom of the gate electrode GE is situated at a position higher than the position for the surface of the barrier layer BA, stress caused by thermal expansion of the gate electrode GE that exerts on the lateral wall or the bottom of the trench T (particularly, end of the bottom of the trench T) can be moderated. For example, stresses caused in the heat treatment step subsequent to the step of forming the trench T and the gate electrode GE (for example, heat treatment step in the step of forming the ohmic layer OL, the source electrode SE, and the drain electrode DE, specifically, a heat treatment at about 550° C. for 30 minutes) can be moderated.

Further, when the bottom of the gate electrode GE is situated to a position higher than the position for the surface of the barrier layer BA, and the end of the bottom of the trench T is formed in a rounded or chamfered shape, the thickness of the gate insulation film GI situated between the end of the bottom of the gate electrode GE and the end of the bottom of the trench T can be decreased to reduce the on resistance of the semiconductor device as has been described specifically in the first and the second embodiments.

(Second Example)

Figure 20:
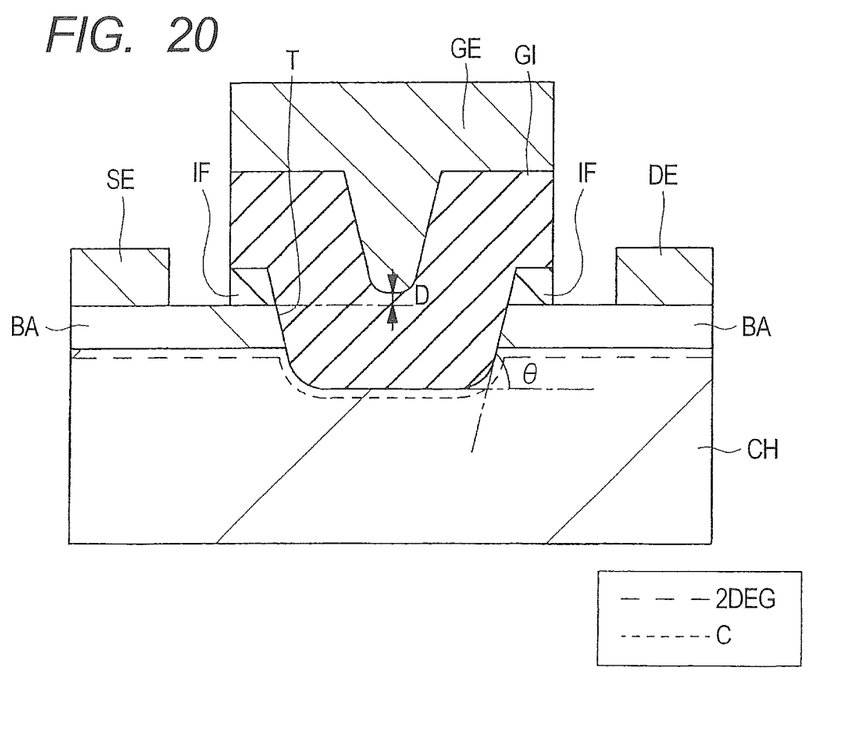
FIG. 20 is a cross sectional view schematically illustrating a configuration of a second example of the semiconductor device of the fourth embodiment.

In the third embodiment (FIG. 17), the bottom of the gate electrode GE is shown at a position lower than the position for the surface of the barrier layer BA but the bottom of the gate electrode GE may be situated also at a position higher than the position for the surface of the barrier layer BA. FIG. 20 is a cross sectional view schematically illustrating the configuration of a second example of the semiconductor device of this fourth embodiment. In this embodiment, since other configurations than those of the trench T, the gate insulation film GI, and the gate electrode GE, and manufacturing steps are identical with those of the embodiment described above, explanation therefor is to be omitted.

In the second example of this embodiment, as illustrated in FIG. 20, the bottom of the gate electrode GE above the trench T is disposed at a position higher by a distance D than the position for the surface of the barrier layer BA.

For example, assuming the depth of the trench T, that is, the distance from the surface of the barrier layer BA to the bottom of the trench T as about 40 nm, the thickness of the gate insulation film GI as about 100 nm, and the tapered angle as about 60°, the inside of the trench T is filled with the gate insulation film GI and the distance D between the surface of the gate insulation film GI (bottom of the gate electrode GE) and the surface of the barrier layer BA is about 60 nm.

As described above, when the bottom of the gate electrode GE is situated at a position higher than the position for the surface of the barrier layer BA, stress caused by thermal expansion of the gate electrode GE that exerts on the lateral wall or the bottom of the trench T (particularly, end of the bottom of the trench T) can be moderated. For example, stresses caused by a heat treatment step subsequent to the step of forming the trench T and the gate electrode GE (for example, heat treatment step in the step of forming the ohmic layer OL, the source electrode SE, and the drain electrode DE, specifically, a heat treatment at about 550° C. for 30 minutes) can be moderated.

As described in the third embodiment, by forming the lateral side of the trench T as the tapered shape, joining of the material for the gate insulation film GI deposited successively on the lateral wall of the trench T and the material for the gate insulation film GI deposited successively over the bottom of the trench T can be moderated to suppress increase of the thickness of the gate insulation film GI.

Further, when the end of the bottom of the trench T is formed as the rounded or chamfered shape, the thickness of the gate insulation film GI situated between the end of the bottom of the gate electrode GE and the end of the bottom of the trench T can be decreased to reduce the on resistance of the semiconductor device as has been described specifically in the first to third embodiments.

While the inventions made by the present inventors have been described specifically with reference to the preferred embodiments, it will be apparent that the invention is not restricted to the embodiments but can be modified variously within a range not departing the gist of the inventions.

What is claimed is:

1. A semiconductor device comprising:
    a first nitride semiconductor layer formed above a substrate;
    a second nitride semiconductor layer formed over the first nitride semiconductor layer and having a band gap larger than that of the first nitride semiconductor layer;
    a trench passing through the second nitride semiconductor layer as far as a midway of the first nitride semiconductor layer; and
    a gate electrode disposed by way of a gate insulation film in an inside of the trench,
    wherein a corner of the trench between a side wall of the trench and a bottom of the trench comprises a chamfered shape, and a corner of the gate insulation film in contact with the corner of the trench comprises a chamfered shape, and
    wherein the corner of the trench comprises a first tapered portion and a second tapered portion situated below the first tapered portion, and an angle formed between the second tapered portion and the bottom of the trench is smaller than an angle formed between the first tapered portion and the bottom of the trench.

2. The semiconductor device according to claim 1, wherein the side wall of the trench comprises a tapered shape.

3. The semiconductor device according to claim 2, wherein a thickness of the gate insulation film situated at the corner of the trench is $\sqrt{2}\times Th/2$ or larger and smaller than $\sqrt{2}\times Th$ assuming a thickness of the gate insulation film on the side wall of the trench as Th.

4. The semiconductor device according to claim 2, wherein a thickness of the gate insulation film situated at the corner of the trench is Th or larger and $\sqrt{2}\times Th \times 0.8$ or smaller assuming a thickness of the gate insulation film on the side wall of the trench as Th.

5. The semiconductor device according to claim 1, further comprising:
    a first electrode and a second electrode formed respectively on both sides of the gate electrode over the second nitride semiconductor layer.

6. The semiconductor device according to claim 1, wherein a bottom of the gate electrode above the trench is situated at a position higher than a position for a surface of the second nitride semiconductor layer.

* * * * *